(12) United States Patent
Singh et al.

(10) Patent No.: US 7,746,107 B1
(45) Date of Patent: *Jun. 29, 2010

(54) REDUNDANT CONFIGURATION MEMORY SYSTEMS AND METHODS

(75) Inventors: Satwant Singh, Fremont, CA (US); Chan-Chi Jason Cheng, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/564,781

(22) Filed: Sep. 22, 2009

Related U.S. Application Data

(63) Continuation of application No. 11/680,526, filed on Feb. 28, 2007, now Pat. No. 7,598,765.

(51) Int. Cl.
    *H03K 19/173* (2006.01)
(52) U.S. Cl. ....................................... 326/38
(58) Field of Classification Search ............. 326/37–41, 326/47, 101
    See application file for complete search history.

(56) References Cited

U.S. PATENT DOCUMENTS 7,254,069 B2 * 8/2007 Haraguchi et al. .......... 365/200
7,505,319 B2 * 3/2009 Wu et al. ................ 365/185.09

* cited by examiner

*Primary Examiner*—Rexford N Barnie
*Assistant Examiner*—Thienvu V Tran

(57) ABSTRACT

In one embodiment, a programmable logic device includes a plurality of configuration memory cells and at least one spare configuration memory cell adapted to store configuration data for a memory cell identified within the plurality of configuration memory cells (e.g., identified as a defective memory cell). An address shift register within the device is adapted to provide programming signals to the plurality of configuration memory cells via wordlines. A data shift register within the device is adapted to provide configuration data to the plurality of configuration memory cells via bitlines. The data shift register is further adapted to provide configuration data from the spare configuration memory cell to the identified configuration memory cell.

14 Claims, 8 Drawing Sheets

US 7,746,107 B1

REDUNDANT CONFIGURATION MEMORY SYSTEMS AND METHODS

RELATED APPLICATION DATA

This application is a continuation of U.S. application Ser. No. 11/680,526, filed Feb. 28, 2007, which is incorporated herein in its entirety.

TECHNICAL FIELD

The present invention relates generally to electrical circuits and, more particularly, to memory, such as for example configuration memory within a programmable logic device.

BACKGROUND

A programmable logic device (PLD), such as for example a field programmable gate array (FPGA) or a complex programmable logic device (CPLD), typically uses configuration memory to store configuration data, which determines (e.g., programs or configures) the PLD's user-defined functions. As the logic capacity and complexity of PLDs increase, the number of configuration memory cells similarly increases and modern PLDs typically employ millions of configuration memory cells.

A drawback of a conventional PLD is that all of the configuration memory cells must operate properly or the PLD typically is deemed defective as it may not be able to perform a user's desired functions. Consequently, defective configuration memory cells may result in significant yield loss for PLD manufacturers. Alternatively, a conventional approach is to provide redundant portions (e.g., including logic blocks, interconnect, configuration memory, etc.) of the PLD that would be used in place of defective portions or provide the desired output signals to the defective portions, with the output signals bypassing the defective components (e.g., as disclosed in U.S. Pat. No. 5,831,907). However, this approach may add significantly to the overhead, requires significant die area to implement, and may reduce PLD performance.

As a result, there is a need for improved techniques directed to defective configuration memory cells within a PLD.

SUMMARY

In one embodiment, a programmable logic device includes a plurality of configuration memory cells and at least one spare configuration memory cell adapted to store configuration data for a memory cell identified within the plurality of configuration memory cells (e.g., identified as a defective memory cell). An address shift register within the device is adapted to provide programming signals to the plurality of configuration memory cells via wordlines. A data shift register within the device is adapted to provide configuration data to the plurality of configuration memory cells via bitlines. The data shift register is further adapted to provide configuration data from the spare configuration memory cell to the identified configuration memory cell.

The data shift register may further be adapted to provide the configuration data from the spare configuration memory cell to the identified memory cell in response to a programming signal from the address shift register.

The data shift register may further be adapted to store configuration data intended for a configuration memory cell in the spare configuration memory cell in response to identification of the configuration memory cell.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
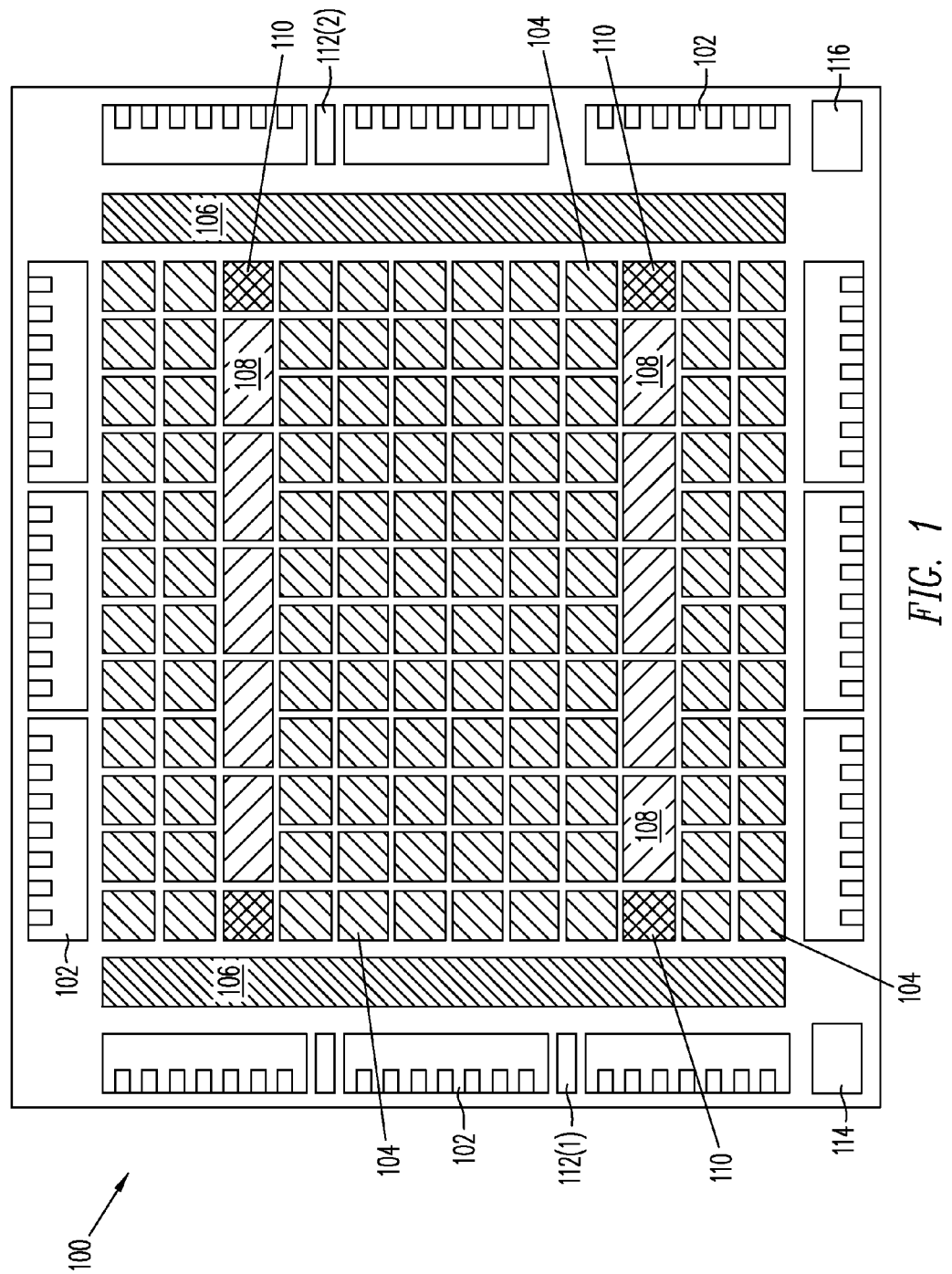
FIG. 1 shows a block diagram illustrating a programmable logic device in accordance with an embodiment of the present invention.

FIG. 1 shows a block diagram illustrating an example of a programmable logic device 100 in accordance with an embodiment of the present invention. PLD 100 (e.g., an FPGA, a CPLD, or any other type of programmable device) generally includes input/output (I/O) blocks 102, logic blocks 104, configuration memory 114, and an interconnect 116.

I/O blocks 102 provide I/O functionality (e.g., supports one or more I/O and/or memory interface standards) for PLD 100. Logic blocks 104 (e.g., also referred to in the art as configurable logic blocks or logic array blocks) provide logic functionality for PLD 100, such as LUT-based logic typically associated with FPGAs or array-based logic typically associated with CPLDs.

Configuration memory 114 represents the memory that is distributed within PLD 100 and that stores the configuration data that determines the user-defined functionality of PLD 100. Configuration memory 114 typically is implemented as static random access memory (SRAM) cells (also referred to herein as configuration RAM (CRAM)) or as other types of volatile or non-volatile memory (e.g., fuses, anti-fuses, or other forms of memory suitable for the techniques discussed herein). Interconnect 116 would typically be distributed throughout PLD 100 to provide programmable routing resources, such as for logic blocks 104.

PLD 100 may also include reprogrammable non-volatile memory 106 (e.g., blocks of EEPROM or flash memory), volatile memory 108 (e.g., block SRAM), clock-related circuitry 110 (e.g., PLL or DLL circuits), and/or one or more data ports 112. Non-volatile memory 106, for example, may be used to store configuration data within PLD 100 for transfer to configuration memory 114 of PLD 100 upon power up or during reconfiguration of PLD 100. This may drastically reduce the time to reconfigure PLD 100 relative to an external bitstream (e.g., reduce the time from seconds to microseconds for loading of configuration data into configuration memory 114).

Data port 112 may be used for programming PLD 100, as would be understood by one skilled in the art. For example, data port 112(1) may represent a programming port such as a central processing unit (CPU) port (also referred to as a peripheral data port, a microprocessor interface, or a sysCONFIG programming port) and/or a serial peripheral interface (SPI) port. Data port 112(2) may represent, for example, a programming port such as a joint test action group (JTAG) port by employing standards such as Institute of Electrical and Electronics Engineers (IEEE) 1149.1 or 1532 standards. Data ports 112(1) and 112(2) are not both required, but one or the other or both may be included to receive configuration data and commands, depending upon the desired application and requirements as would be understood by one skilled in the art.

It should be understood that the number and placement of the various elements (some of which may be optional), such as I/O blocks 102, logic blocks 104, non-volatile memory 106, volatile memory 108, clock-related circuitry 110, data port 112, configuration memory 114, and interconnect 116 is not limiting and may depend upon the desired application. Furthermore, it should be understood that the elements are illustrated in block form for clarity and that certain elements, such as configuration memory 114 and interconnect 116 would typically be distributed throughout PLD 100 (e.g., in and between logic blocks 104) to perform their conventional functions (e.g., storing configuration data that configures PLD 100 and providing programmable routing resources, respectively).

In accordance with one or more embodiments of the present invention, systems and methods are disclosed to provide redundancy for memory cells of configuration memory 114. As noted above, one or more defective configuration memory cells may result in a conventional PLD being categorized as defective, resulting in yield-loss for the PLD manufacturer. However, if configuration memory redundancy is provided, the PLD manufacturer may produce higher density PLDs that may provide improved yield results, an improved cost structure, and the configuration memory density may scale in a similar fashion as other types of memory.

Configuration memory cells may fail for example due to hard failure defects or due to soft failure defects. An example of a hard failure may be a short between two power supply rails or an open circuit to a power supply rail, while a soft failure may be attributed for example to intra-chip transistor variations that result in the configuration memory cell falling below minimum performance thresholds.

Figure 2:
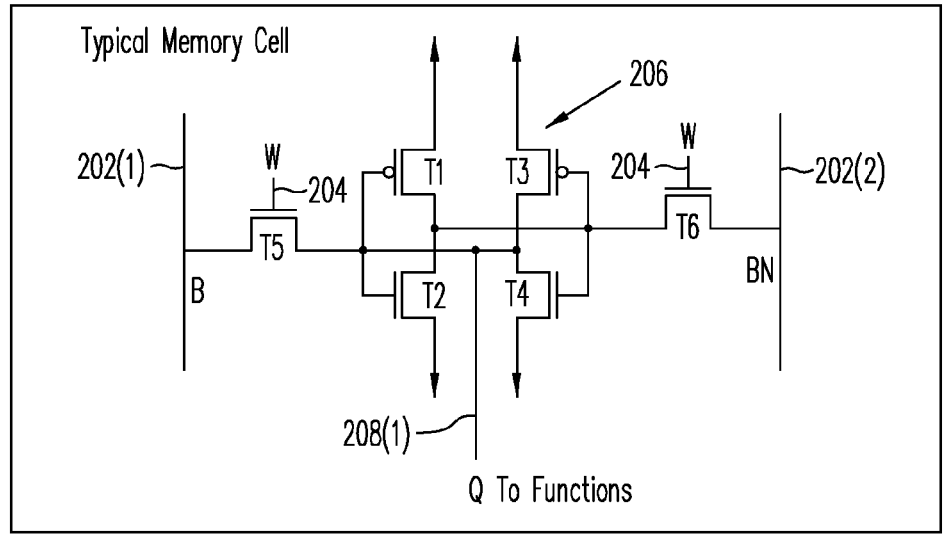
FIG. 2 shows a circuit diagram illustrating a conventional configuration memory cell that is used in accordance with an embodiment of the present invention.

As an example, FIG. 2 shows a memory cell (MC) 200 illustrating a conventional configuration memory cell (e.g., a six transistor memory cell) that may be utilized in accordance with an embodiment of the present invention. Memory cell 200 includes transistors 206 (labeled T1 through T6), with four of transistors 206 (T1 through T4) implemented to form the two inverters for the memory cell or latch. Two of transistors 206 (T5 and T6) are coupled to bitlines 202 (e.g., complementary bitlines 202(1) and 202(2), labeled B and BN, respectively) and wordline 204 (labeled W) for performing the read/write functions of memory cell 200, as would be understood by one skilled in the art. An output 208 (labeled Q or complementary outputs Q and QN) from memory cell 200 is provided to control user-programmable functions within the PLD.

Figure 3A:
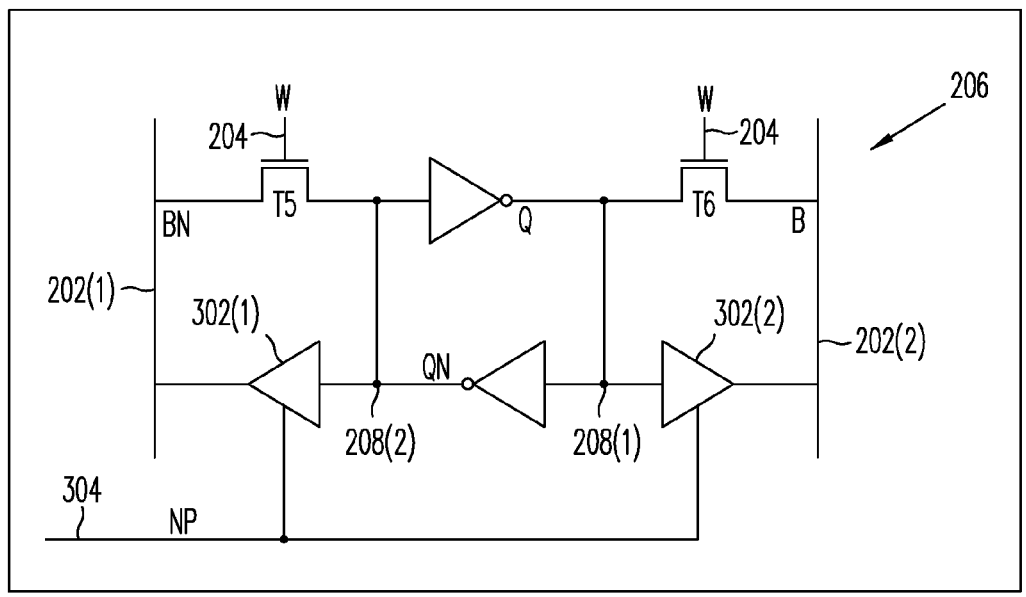
FIG. 3a shows a circuit diagram illustrating a configuration memory cell in accordance with an embodiment of the present invention.

As another example, FIG. 3a shows a memory cell 300 illustrating a configuration memory cell that may be utilized in accordance with an embodiment of the present invention. Memory cell 300 (also referred to herein as a memory cell with drivers (MCD)) includes transistors 206 and associated bitlines 202 and wordline 204, as shown similarly for memory cell 200 (FIG. 2), but memory cell 300 further includes drivers 302. Drivers 302 (labeled drivers 302(1) and 302(2)) are controlled by a control signal on a line 304 (e.g., the signal labeled NP and provided on line 304 to drivers 302 as shown).

For example, when memory cell 300 is being programmed, drivers 302 are switched off by a control signal on line 304 and memory cell 300 is programmed in a conventional fashion. However, when memory cell 300 is not being programmed, drivers 302 may be switched on by the control signal on line 304, with drivers 302 driving logical values of output 208 (e.g., output 208(1) and 208(2) for Q and QN, respectively) from memory cell 300 to corresponding bitlines 202, as shown in FIG. 3a.

Figure 3B:
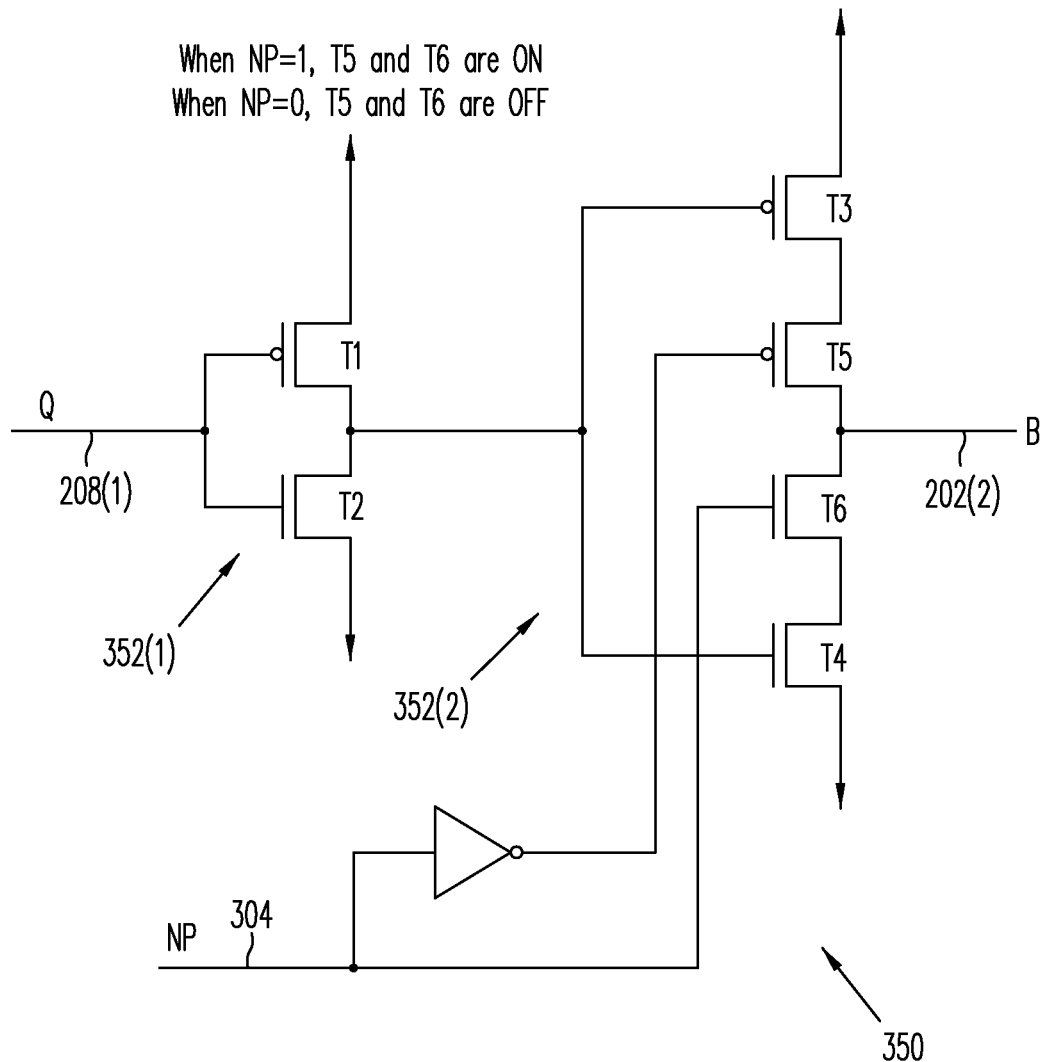
FIG. 3b shows a circuit diagram illustrating an exemplary driver for the configuration memory cell of FIG. 3a in accordance with an embodiment of the present invention.

Referring briefly to FIG. 3b, a circuit 350 illustrates an example of a circuit implementation for driver 302 (e.g., driver 302(2)) for memory cell 300 of FIG. 3a in accordance with an embodiment of the present invention. Circuit 350 includes two inverters 352(1) and 352(2), with the control signal NP on line 304 controlling whether inverter 352(2) (and consequently circuit 350) is switched on or off, as illustrated in FIG. 3b.

As logic gate and configuration memory densities increase, simulation results indicate that a significant number of PLD defects will be due to one or more defective configuration memory cells. For example, potential soft failure defects due to intra-chip transistor variations within memory cell 200 may include a failure to be programmed to a logical zero or a logical one, a failure to maintain the programmed logical value, a failure to adequately drive bitlines 202 or switching to the opposite logical value during a read operation, and/or switching to the opposite logical value during signal transitions within the PLD.

Figure 4:
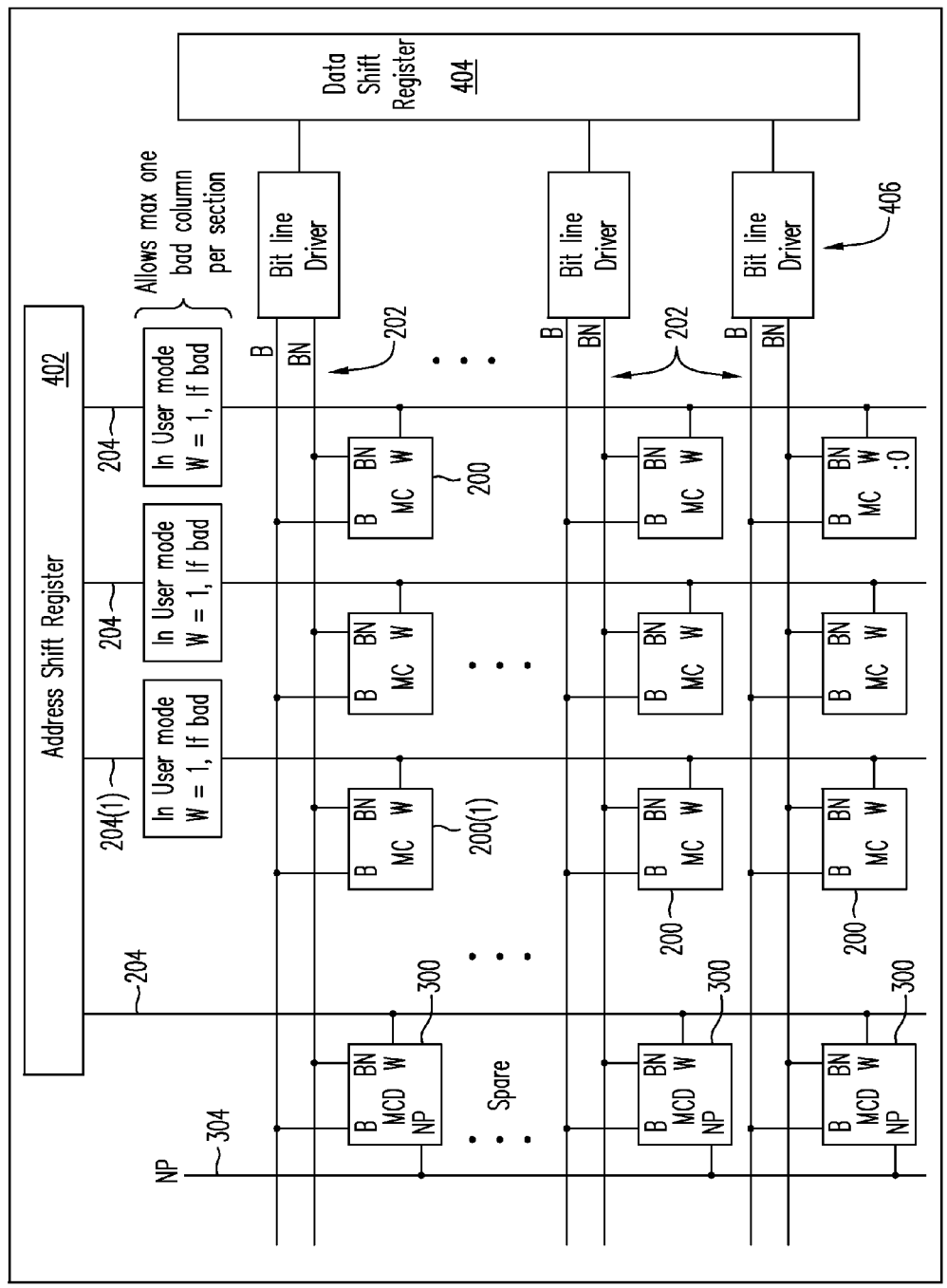
FIG. 4 shows a block diagram illustrating a configuration memory cell array and associated circuitry for the programmable logic device of FIG. 1 in accordance with an embodiment of the present invention.
Figure 5:
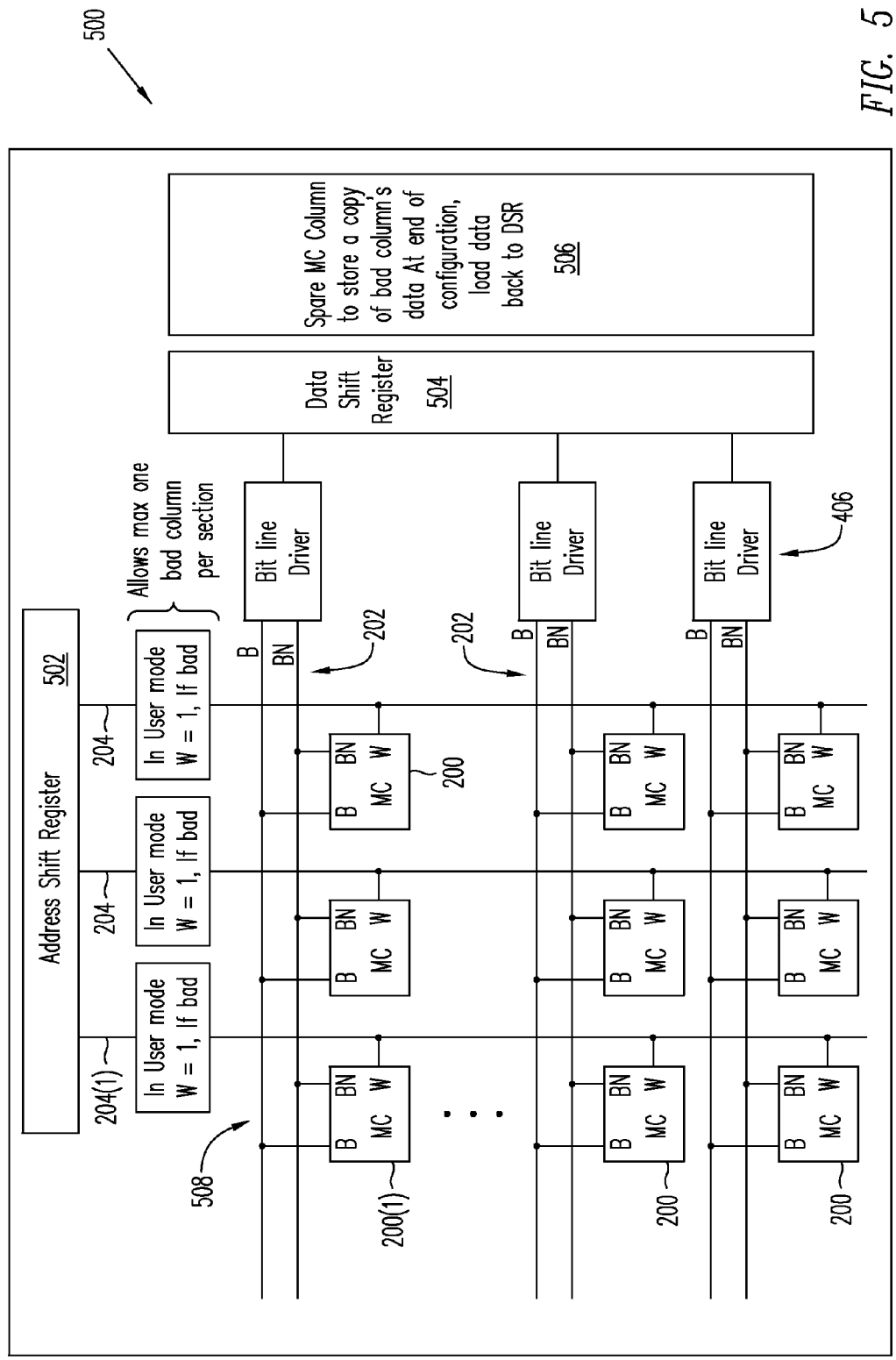
FIG. 5 shows a block diagram illustrating a configuration memory cell array and associated circuitry for the programmable logic device of FIG. 1 in accordance with an embodiment of the present invention.

FIGS. 4 and 5 show circuits 400 and 500 illustrating block diagrams of a configuration memory cell array and associated circuitry in accordance with one or more embodiments of the present invention. Circuit 400 and/or circuit 500 may be implemented within PLD 100 (FIG. 1), for example, to provide a form of configuration memory cell redundancy (e.g., for configuration memory 114) and/or provide a repair mechanism for certain ones of the configuration memory cells that are not meeting minimum operational requirements (below minimum performance thresholds).

Circuit 400 includes memory cells 200, bitlines 202, wordlines 204, memory cells 300 controlled by the control signal NP on line 304, an address shift register (ASR) 402, and a data shift register (DSR) 404. Memory cells 200 are typically arranged in a two-dimensional fashion (e.g., forming at least a portion of configuration memory 114 within interconnect 116, logic blocks 104, and other parts of PLD 100) and may number in the thousands or millions, but for clarity only a few rows and columns of memory cells 200 are shown. Memory cells 300 (e.g., spare memory cells) are included to provide a form of redundancy and compensate for defective ones of memory cells 200.

As an example, each wordline 204 is coupled to one column of memory cells (e.g., memory cells 200 or memory cells 300), while one set of bitlines 202 are coupled to one row of memory cells (e.g., memory cells 200 or memory cells 300). However, it should also be noted that the terms row and column are interchangeable and not limiting and that the term row may be used to describe a row or a column and likewise the term column may be used to describe a row or a column.

As a programming example with no defective memory cells 200, ASR 402 drives a logical low signal on wordlines 204, while DSR 404 drives (e.g., using bitline drivers 406) a data signal for one column on bitlines 202 (i.e., complementary data signals on B and BN). ASR 402 then drives a logical high signal on one wordline 204 (e.g., wordline 204(1)), while maintaining the logical low signal on the remaining wordlines 204 so that the data on bitlines 202 is written into a column of memory cells 200 associated with one wordline 204 (e.g., wordline 204(1)). After the data is written for the one column, ASR 402 drives a logical low signal on wordlines 204 and the process repeats for each column of data to be written (e.g., column by column programming). Thus, the programming is similar to a conventional programming operation and memory cells 300 are not used in this example (e.g., not programmed and the control signal NP on line 304 maintains drivers 302 in a switched off state) as there are no defective memory cells 200 (as explained further herein).

After the configuration data is programmed into memory cells 200, PLD 100 (which incorporates circuit 400 for this example) begins its normal operation (often referred to as "user mode") to perform the logic functions and operate as intended for the particular design. Typically, during user mode, ASR 402 maintains a logical low signal on wordlines 204 and DSR 404 maintains a logical high signal on bitlines 202.

In accordance with one or more embodiments of the present invention, if one or more memory cells 200 are not operating properly, then memory cells 300 of circuit 400 may be employed. Memory cells 300 may be used, for example, to provide the proper configuration data values on bitlines 202 during the user mode of operation for memory cells 200 that are defective (i.e., not meeting operational specifications or requirements) so that these defective memory cells 200 can supply proper values on their output 208 (i.e., Q and/or QN signal values).

As a programming example, if memory cell 200(1) in FIG. 4 is defective, the programming would occur as discussed above except that ASR 402 would drive a logical high signal on wordline 204 associated with memory cells 300 rather than (or in addition to) wordline 204(1) associated with defective memory cell 200(1). During the programming operation, a control signal (e.g., the signal NP) on line 304 associated with memory cells 300 would maintain drivers 302 in a switched off state (e.g., the signal NP provides a logical low signal to drivers 302). Thus, during the programming operation, the spare column of memory cells 300 is programmed with the same configuration data as intended for the column of memory cells 200 associated with memory cell 200(1) and wordline 204(1) (i.e., the defective column of memory cells 200).

After the configuration data is programmed into memory cells 200 and memory cells 300, PLD 100 (which incorporates circuit 400 for this example) begins its normal user mode of operation to perform the logic functions and operate as intended for the particular design. During general user mode of operation, the control signal NP on line 304 (e.g., providing a logical high signal) maintains drivers 302 of memory cells 300 in a switched on state to drive bitlines 202 while ASR 402 maintains a logical high signal on wordline 204(1) (i.e., wordline 204 associated with one or more defective memory cells 200, such as memory cell 200(1) for this example). DSR 404 would not drive bitlines 202 during user mode of operation, but rather allow memory cells 300 to drive bitlines 202.

Consequently, memory cell 200(1) and the associated memory cells 200 in the same column are supplied with a logical high signal on wordline 204(1) and the appropriate data is driven on bitlines 202 by memory cells 300, which forces output 208 (Q and QN) of memory cells 200 of wordline 204(1) to their proper data values. Thus, memory cells 300 provide a form of redundancy by providing support to the column of memory cells 200 with one or more defective memory cells 200 (e.g., memory cell 200(1)) by providing the proper data values on bitlines 202 to maintain the proper values within the column having defective ones of memory cells 200 (e.g., the column of memory cells 300 supports the entire column of memory cells 200 having one or more defective memory cells 200).

During a readback operation for the data from circuit 400, ASR 402 and DSR 404 would control wordlines 204 and bitlines 202, respectively, in a conventional fashion, except that the data values are read from memory cells 300 rather than the column of memory cells 200 associated with memory cell 200(1). For example, ASR 402 provides a logical high signal on wordline 204 associated with memory cells 300 and the control signal NP on line 304 may also optionally switch on drivers 302 to drive out the data on bitlines 202 for the readback of the configuration data associated with memory cell 200(1).

During the readback operation of circuit 400, drivers 302 of memory cells 300 are switched off by the control signal NP on line 304, except for optionally during the readback of the column associated with memory cell 200(1). Thus, defective memory cell 200(1) is expected to hold its data value during the duration of the readback operation for circuit 400. Upon completion of the readback operation, the general user mode of operation would resume (e.g., the control signal NP maintains drivers 302 of memory cells 300 in a switched on state to drive bitlines 202 while ASR 402 maintains a logical high signal on wordline 204(1)).

Circuit 400 may provide certain advantages over conventional approaches. For example, defective memory cell 200(1) and the associated memory cells 200 in the defective column of wordline 204(1) will not need to provide (i.e., drive back) their data values during a readback operation and will not lose their data values over time because the column of memory cells 300 provides their data values on bitlines 202 to maintain the proper data values within memory cell 200(1) and associated memory cells 200 in the column. It should also be noted that memory cells 300, including drivers 302, may be sized appropriately (e.g., taking into account process variations) to write to the defective column.

In general, any defective memory cells 200 within circuit 400 would not have a hard defect failure (e.g., no structural defect) so that transistors 206 generally still function. The failure would typically be a soft defect failure (e.g., transistor variations and mismatches, such as for example associated with $I_{ON}$, $I_{OFF}$, $V_{TH}$, and/or other general transistor characteristics). Memory cells 200 that are defective should be associated with the same wordline (e.g., wordline 204(1)) so that these defective memory cells can be supported by the column of memory cells 300, as discussed above.

However, it should be understood that this is not limiting and that circuit 400 may represent or provide one section of configuration memory for PLD 100, with PLD 100 having a number of circuits 400 to provide configuration memory 114 and sufficient configuration memory redundancy using the techniques discussed herein (e.g., in reference to FIG. 4). Alternatively, there may be multiple sections of memory cells 200 and memory cells 300 within circuit 400 to provide sufficient configuration memory redundancy and support for the estimated defect rate of configuration memory cells.

PLD 100 may also store information (e.g., in non-volatile memory 106) regarding defective memory cells and/or the associated wordlines 204 (e.g., wordline address). For example, wordline addresses or other information may be stored in non-volatile memory 106 of PLD 100 to provide proper operation for the various modes of operation and to properly control ASR 402, DSR 404, wordlines 204, bitlines 202, and the control signal on line 304 to provide redundancy and support for defective ones of memory cells 200 in one or more circuits 400 within PLD 100.

Referring to FIG. 5, circuit 500 provides another example in accordance with one or more embodiments of the present invention for providing support for defective memory cells and a form of configuration memory cell redundancy for PLD 100. Circuit 500 includes ASR 502, DSR 504, memory cells 200, bitlines 202, and wordlines 204.

Circuit 500 is similar to circuit 400 (FIG. 4), but circuit 500 does not require implementation of memory cells 300. Instead, circuit 500 includes a spare column 506 of memory cells 200 (e.g., spare memory cells) that may be used to store a copy of the configuration data provided to a column of memory cells 200 (e.g., column 508) having a defective memory cell (e.g., memory cell 200(1)).

As a programming example, ASR 502 and DSR 504 load memory cells 200 with the configuration data in a conventional fashion, but the configuration data for defective column 508 is stored in (or also stored in) column 506 (e.g., a shadow spare column). After the configuration data is programmed (e.g., loaded or configured) into memory cells 200, the configuration data stored by memory cells 200 within column 506 is provided to DSR 504. During a user mode of operation, ASR 502 provides a logical high signal on wordline 204(1) associated with column 508 and DSR 504 will provide (e.g., via its bitline drivers 406) on bitlines 202 the configuration data provided by column 506. Therefore, the proper values of configuration data will be maintained in memory cells 200 of column 508, including any defective memory cells 200 (e.g., memory cell 200(1)) within column 508.

During a readback operation, DSR 504 may read the configuration data from column 506 rather than from column 508 having defective memory cells 200. Memory cells 200 in column 506 may be viewed as functioning in a similar fashion as memory cells 300 (FIG. 4) from a view that column 506 provides a copy of the configuration data onto bitlines 202 (e.g., via DSR 504) during user mode of operation to maintain the proper configuration data values within defective ones of memory cells 200.

Circuit 500 may provide advantages similar to those discussed above in reference to circuit 400 (FIG. 4). Also as discussed with reference to circuit 400, PLD 100 may also store information (e.g., in non-volatile memory 106) regarding defective memory cells and/or the associated wordlines 204 (e.g., wordline address) to provide proper operation for the various modes of operation. Furthermore, it should be understood that circuit 500 may represent or provide one section of configuration memory for PLD 100, with PLD 100 having a number of circuits 500 to provide configuration memory 114 and sufficient configuration memory redundancy using the techniques discussed herein (e.g., in reference to FIG. 5). Alternatively, there may be multiple sections of memory cells 200 and redundant (or spare) columns 506 of memory cells 200 within circuit 500 to provide sufficient configuration memory redundancy.

Figure 6:
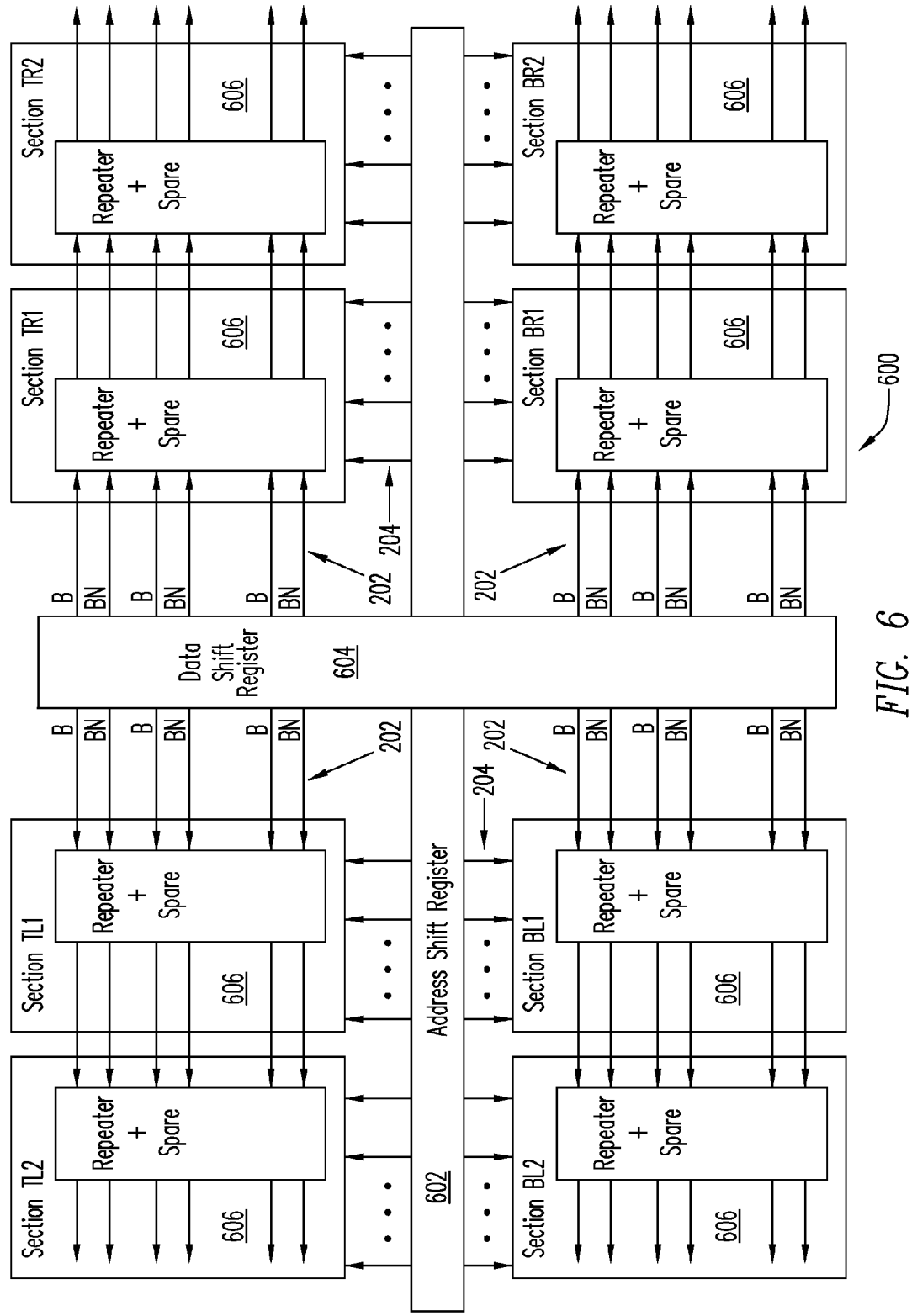
FIG. 6 shows a block diagram illustrating a configuration memory cell array and associated circuitry for the programmable logic device of FIG. 1 in accordance with an embodiment of the present invention.

For example, FIG. 6 shows a circuit 600 that provides an example of multiple sections of configuration memory for providing sectional support for defective memory cells and a form of configuration memory cell redundancy for PLD 100 of FIG. 1 in accordance with an embodiment of the present invention. Circuit 600 includes ASR 602, DSR 604, and a number of sections 606.

Sections 606 (e.g., eight are shown as an example but any number of sections may be implemented) represent sections of the memory cell array, with each section 606 having a spare column of memory cells (e.g., spare column 506) for providing support for a defective column of memory, such as discussed in reference to FIG. 5 for circuit 500. Thus, each section 606 (e.g., TL2 or BR1) provides one spare column that can be used to repair a defective column within that section.

Figure 7:
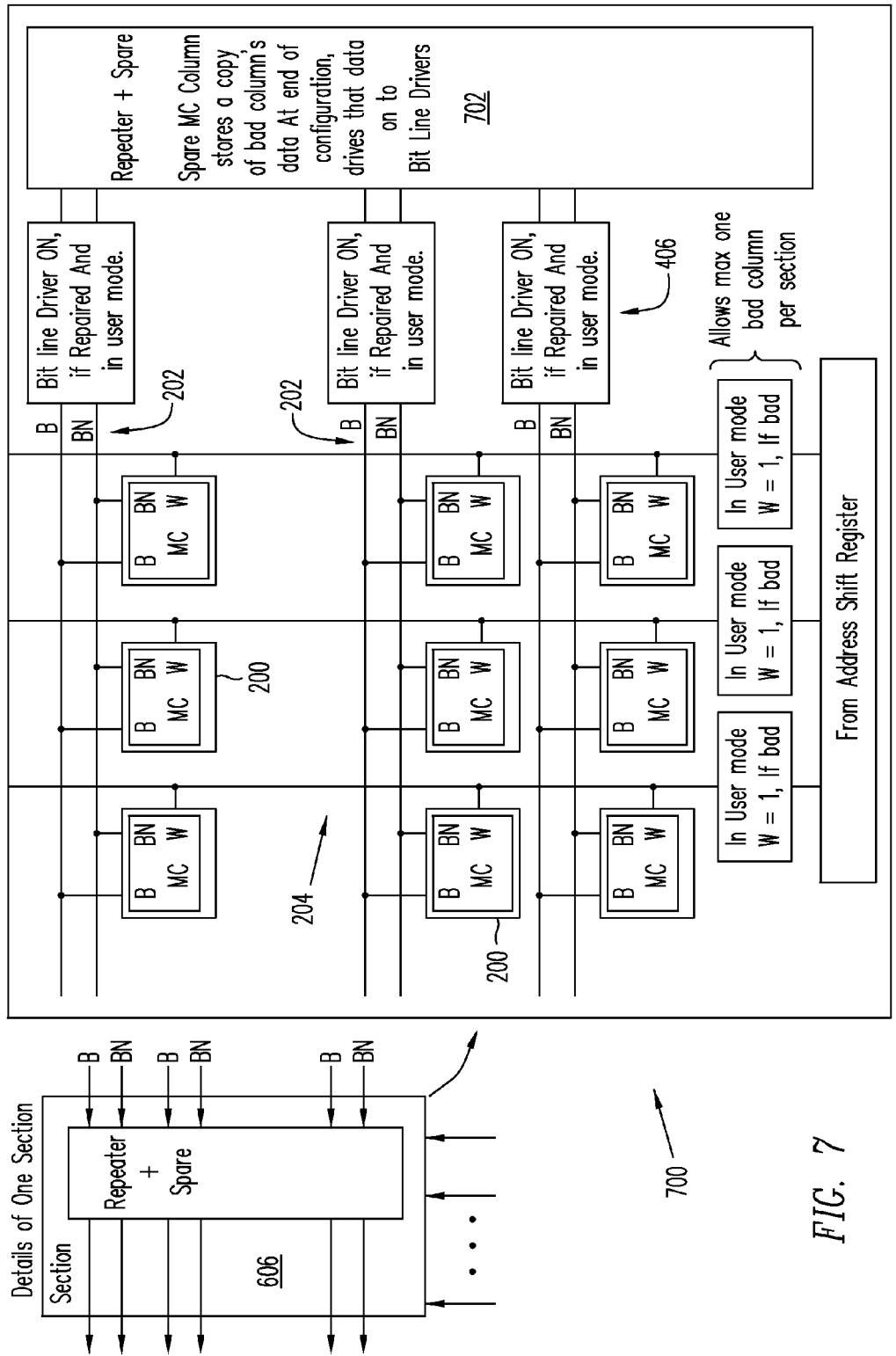
FIG. 7 shows a block diagram illustrating a portion of the configuration memory cell array and associated circuitry of FIG. 6 in accordance with an embodiment of the present invention.

As an example, FIG. 7 shows a circuit 700 which illustrates exemplary details for one section 606 of FIG. 6 in accordance with an embodiment of the present invention. Circuit 700 includes memory cells 200, bitlines 202, wordlines 204, bitline drivers 406, and a block 702, which includes spare column 506 of memory cells 200 and bitline repeaters. The bitline repeaters provide the desired bitline signals for corresponding sections 606 in a similar fashion as discussed in reference to FIG. 5 for DSR 504.

Figure 8:
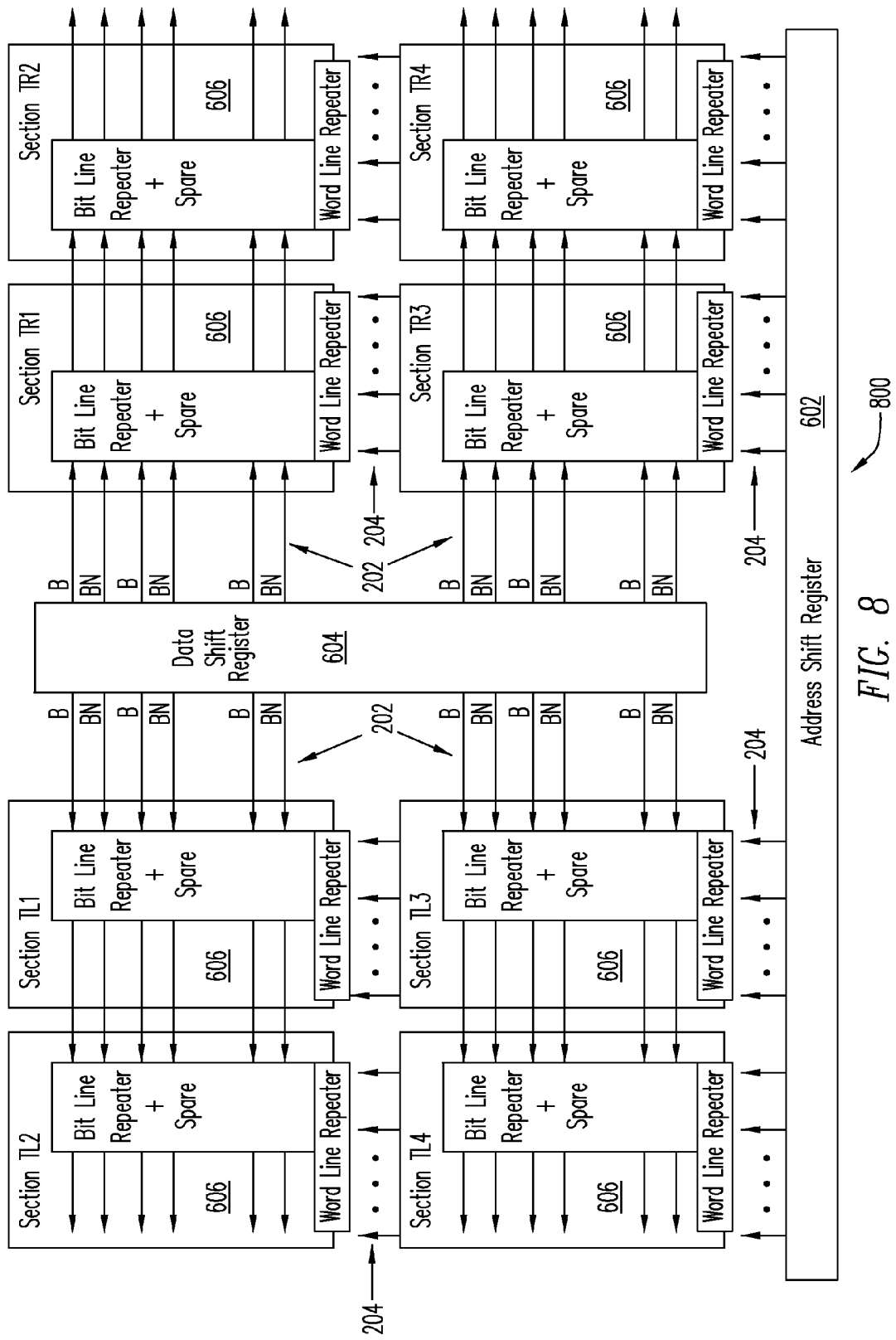
FIG. 8 shows a block diagram illustrating a configuration memory cell array and associated circuitry for the programmable logic device of FIG. 1 in accordance with an embodiment of the present invention.

As another implementation example, FIG. 8 shows a circuit 800, which is similar to circuit 600, but also includes wordline repeaters for each section 606 in accordance with an embodiment of the present invention. The wordline repeaters provide the desired wordline signals for corresponding sections 606 in a similar fashion as discussed in reference to FIG. 5 for ASR 502.

In general in reference to FIGS. 6-8, ASR 602 and DSR 604 would load configuration data into memory cells 200 of circuit 600 for all sections 606 (e.g., via the bitline repeaters or via the bitline and wordline repeaters) in a manner similar to that described for circuit 500. During a user mode of operation, if a defective column of memory is within circuit 700 (e.g., section needing repair and as an example for any of sections 606), ASR 602 (or the wordline repeater for the corresponding section 606 if implemented) asserts a logical high signal on wordline 204 associated with the defective column of memory and block 702 provides the configuration data from column 506 to bitline drivers 406 and the configuration data is driven onto bitlines 202 to maintain the correct configuration data values within memory cells 200 of the defective column. Therefore, PLD 100 utilizing the techniques discussed herein may have multiple sections of configuration memory that may receive support for defective memory cells to provide a form of configuration memory redundancy.

As a specific example in reference to FIG. 8, the wordline repeaters for the corresponding sections 606 provide the appropriate wordline signals (e.g., logical low signals for each section 606 during user mode if no repair is needed (no defective column of memory). If for example section 606 labeled Section TL1 requires a repair (defective column of memory present), the wordline repeater associated with the Section TL1 provides the wordline signals (e.g., ignoring the wordline signals provided by the wordline repeater associated with the Section TL3), with one wordline signal having a logical high signal and provided to the defective column of memory (e.g., as discussed herein). If for example the Section TL3 requires a repair but no repair is required in the Section TL1, then the wordline repeater associated with the Section TL3 provides a logical high wordline signal to the defective column, while the wordline repeater associated with the Section TL1 provides logical low wordline signals (e.g., during user mode and ignoring the signals from the wordline repeater associated with the Section TL3) because there are no defective column of memory cells. As another example, if a repair is required in the Sections TL1 and TL3, then the associated wordline repeaters would provide the appropriate wordline signals to repair the defective columns in their corresponding sections. As noted previously, the information regarding defective memory cells and/or defective columns may be stored within the PLD (e.g., in non-volatile memory 106 of PLD 100 for each section 606) to provide proper operation for the various modes of operation (e.g., to properly control ASR 602, DSR 604, the bitline repeaters, the wordline repeaters, wordlines 204, and/or bitlines 202, depending upon the specific implementation).

Systems and methods are disclosed herein to provide techniques with respect to defective memory cells. For example, in accordance with an embodiment of the present invention, a programmable logic device is disclosed that provides a form of redundancy for configuration memory (e.g., configuration RAM (CRAM)). In one embodiment, a set of spare CRAM bits are provided to assist one or more CRAM bits, which do not meet expected functionality levels, to maintain proper configuration data values and operate in a desired fashion. The spare CRAM bits, for example, may include drivers or may utilize the drivers of the data shift register to provide proper configuration data values on the bitlines for the defective memory cells. It should be understood that embodiments of the present invention are not limited to CRAM bits and that other types of suitable configuration memory cells (volatile or non-volatile, as discussed herein) may be substituted for the spare CRAM bits and/or for the CRAM bits of the configuration memory.

The data shift register and the address shift register may be operated appropriately to provide conventional operations, such as the loading of the configuration data into the memory cells, but may also be operated to support redundancy operations as discussed herein. For example as illustrated in FIGS. 4 and 5, the wordline associated with one or more defective memory cells is provided with a logical high during user mode of operation (e.g., W=1 if bad column) while the proper configuration data values are maintained on the bitlines to force the defective memory cells to maintain and provide the desired output signals (Q and/or QN) based on the provided configuration data values.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
   a plurality of configuration memory cells;
   at least one spare configuration memory cell adapted to store configuration data for a memory cell identified within the plurality of configuration memory cells;
   a plurality of bitlines;
   a plurality of wordlines;
   an address shift register adapted to provide programming signals to the plurality of configuration memory cells via the wordlines; and
   a data shift register adapted to provide configuration data to the plurality of configuration memory cells via the bitlines and further adapted to provide configuration data from the spare configuration memory cell to the identified configuration memory cell.

2. The programmable logic device of claim 1, wherein the data shift register is adapted to provide the configuration data from the spare configuration memory cell to the identified memory cell in response to a programming signal from the address shift register.

3. The programmable logic device of claim 1, wherein the data shift register is adapted to store configuration data intended for the identified configuration memory cell in the spare configuration memory cell in response to an indication that the identified configuration memory cell is defective.

4. The programmable logic device of claim 1 including non-volatile memory adapted to store information regarding a wordline associated with an identified configuration memory cell.

5. The programmable logic device of claim 1, wherein the plurality of configuration memory cells forms columns of configuration memory cells, and the spare configuration memory cell is included in at least a column of spare configuration memory cells.

6. The programmable logic device of claim 5, wherein:
   each column of configuration memory cells is coupled to the address shift register via a wordline;
   each row of configuration memory cells within the columns is coupled to the data shift register via a pair of bitlines; and
   the column of spare configuration memory cells is coupled to the data shift register but not to the address shift register.

7. The programmable logic device of claim 6, wherein the columns of configuration memory cells are formed into sections with multiple columns, with each section including a column of spare configuration memory cells and a bit line repeater.

8. The programmable logic device of claim 7, wherein each section includes a wordline repeater.

9. A programmable logic device comprising:
   a plurality of configuration memory cells;
   at least one spare configuration memory cell adapted to store configuration data for a memory cell identified within the plurality of configuration memory cells;
   a plurality of bitlines;
   a plurality of wordlines;
   means for providing programming signals to the plurality of configuration memory cells via the wordlines; and
   means for providing configuration data to the plurality of configuration memory cells via the bitlines and for providing configuration data from the spare configuration memory cell to the identified configuration memory cell.

10. A programmable logic device comprising:

a plurality of columns of configuration memory cells;

at least one column of spare configuration memory cells adapted to store configuration data for a memory cell identified within a column of configuration memory cells;

an address shift register coupled to the columns of configuration memory cells via wordlines and adapted to provide programming signals to the configuration memory cells; and a data shift register coupled to the columns of configuration memory cells via bitlines and adapted to provide configuration data to the configuration memory cells, wherein the data shift register is further coupled to the column of spare configuration memory cells and adapted to provide configuration data from the spare configuration memory cells to a column of configuration memory cells that includes the identified configuration memory cell in response to a programming signal from the address shift register.

11. The programmable logic device of claim 10, wherein the column of spare configuration memory cells is coupled to the data shift register but not to the address shift register.

12. The programmable logic device of claim 10, wherein the columns of configuration memory cells are formed into sections with multiple columns, with each section including a column of spare configuration memory cells and a bit line repeater.

13. The programmable logic device of claim 12, wherein each section includes a wordline repeater.

14. The programmable logic device of claim 10, wherein the data shift register is adapted to store configuration data intended for a configuration memory cell in the spare configuration memory cell in response to identification of the configuration memory cell.

* * * * *